US008222927B2

(12) United States Patent
Liao et al.

(10) Patent No.: US 8,222,927 B2
(45) Date of Patent: Jul. 17, 2012

(54) REFERENCE BUFFER CIRCUIT

(75) Inventors: Chieh-Wei Liao, Taipei County (TW); Wen Hua Chang, Tainan County (TW); Tse-Hsiang Hsu, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 112 days.

(21) Appl. No.: 12/420,998

(22) Filed: Apr. 9, 2009

(65) Prior Publication Data

US 2010/0259303 A1 Oct. 14, 2010

(51) Int. Cl.
*H03K 3/00* (2006.01)

(52) U.S. Cl. .......................................................... 327/108

(58) Field of Classification Search ......................... None
See application file for complete search history.

(56) References Cited

U.S. PATENT DOCUMENTS

| | | | | | |
|---|---|---|---|---|---|
| 5,376,832 | A | * | 12/1994 | Gariboldi et al. | 327/108 |
| 5,404,053 | A | * | 4/1995 | Poma et al. | 327/108 |
| 6,054,876 | A | * | 4/2000 | Horie et al. | 326/83 |
| 6,396,334 | B1 | | 5/2002 | Aram | |
| 7,042,281 | B2 | * | 5/2006 | Baglin et al. | 327/541 |
| 7,554,305 | B2 | * | 6/2009 | Nunokawa et al. | 323/273 |
| 7,639,059 | B1 | * | 12/2009 | Yu et al. | 327/333 |
| 2006/0186934 | A1 | * | 8/2006 | Nishimura | 327/108 |

* cited by examiner

*Primary Examiner* — Lincoln Donovan
*Assistant Examiner* — Khareem E Almo
(74) *Attorney, Agent, or Firm* — Thomas|Kayden

(57) ABSTRACT

A reference buffer circuit is provided, comprising a reference buffering stage and a driving stage. The buffering stage provides a first driving voltage based on a first input voltage. The driving stage is driven by the first driving voltage to output a first output voltage. In the buffering stage, a first operational amplifier has a first input end for receiving the first input voltage, a second input end, and an output end for outputting a first tracking voltage. A first level shifter is coupled to the output end of the first operational amplifier, shifting a level of the first tracking voltage to generate the first driving voltage. A first buffering transistor has a drain coupled to a first supply voltage, a source connected to the second input end of the first operational amplifier, and a gate coupled to the first charge pump for receiving the first driving voltage.

19 Claims, 6 Drawing Sheets

REFERENCE BUFFER CIRCUIT

BACKGROUND OF THE INVENTION

1. Field of the Invention

The invention relates to reference buffer circuits, and in particular, to an enhanced reference buffer circuit structure capable of providing reference voltages with a large range.

2. Description of the Related Art

In analog circuit applications, particularly for analog to digital converters (ADCs) such as pipeline ADC, Flash ADC, and SAR ADC, a reference buffer circuit with sufficient driving capability is an essential component to provide accurate reference voltages. As the technology advances, the supply power for circuit design is required to be lower than ever, therefore it is getting challenging to implement a reference buffer circuit with low supply power while its driving capability remains sustainable.

FIG. 1 shows a conventional reference buffer circuit 100. The reference buffer circuit 100 mainly comprises a buffering stage 110 and a driving stage 120 both driven by a supply voltage $V_{DD}$. The buffering stage 110 provides a high driving voltage $V_{GH}$ and a low driving voltage $V_{GL}$ respectively based on a high input voltage $V_{inH}$ and a low input voltage $V_{inL}$, and the driving stage is driven by the high driving voltage $V_{GH}$ and the low driving voltage $V_{GL}$ to output a high output voltage $V_{outH}$ and a low output voltage $V_{outL}$. Specifically, the buffering stage 110 comprises a first NMOS transistor M1 with its drain coupled to the supply voltage $V_{DD}$, and a first PMOS transistor M2 with its drain connected to a signal ground. A first operational amplifier OP1 has two input ends and one output end. The first input end receives the high input voltage $V_{inH}$, the second input end is connected to the source of the first NMOS transistor M1, and an output end is coupled to the gate of the first NMOS transistor M1 to provide the high driving voltage $V_{GH}$. The second operational amplifier OP2 has the same deployment. The first input end of the second operational amplifier OP2 receives the low input voltage $V_{inL}$, the second input end is connected to the source of the first PMOS transistor M2, and the output end coupled to the gate of the first PMOS transistor M2 provides the low driving voltage $V_{GL}$. Optionally, at least one buffering stage resistor $R_B$ is coupled between the sources of the first NMOS transistor M1 and first PMOS transistor M2 to generate a voltage drop. By applying the high input voltage $V_{inH}$ to the first operational amplifier OP1, the first operational amplifier OP1 locks the gate voltage of first NMOS transistor M1 at the high driving voltage $V_{GH}$. Likewise, the second operational amplifier OP2 is controlled by the low input voltage $V_{inL}$ to lock the gate voltage of first PMOS transistor M2 at the low driving voltage $V_{GL}$. Thereby, the driving stage 120 is driven by the high driving voltage $V_{GH}$ and low driving voltage $V_{GL}$ to accurately output the high output voltage $V_{outH}$ and low output voltage $V_{outL}$.

Specifically, the driving stage 120 comprises two MOSFETs and a resistor. The second NMOS transistor M3 has a drain for receiving the supply voltage $V_{DD}$, a gate for receiving the high driving voltage $V_{GH}$, and a source for outputting the high output voltage $V_{outH}$. Symmetrically, the second PMOS transistor M4 has a drain coupled to the signal ground, a gate coupled to the low driving voltage $V_{GL}$, and a source for outputting the low output voltage $V_{outL}$. At least one driving stage resistor $R_D$ may be put between the sources of the second NMOS transistor M3 and second PMOS transistor M4. The driving stage 120 is also referred to as a replica circuit, in which the high output voltage $V_{outH}$ and low output voltage $V_{outL}$ are used as reference voltages that can possess high driving capabilities.

In order to enlarge the dynamic range of the reference voltage to meet the system requirement, the low output voltage $V_{outL}$ is required to be reduced; however, due to the circuit characteristic of the reference buffer circuit 100, the low output voltage $V_{outL}$ can not be lower than the gate-to-source voltage of the second PMOS transistor M4. In other words, the low output voltage $V_{outL}$ is lower bounded. Likewise, the high output voltage $V_{outH}$ is upper bounded. These physical limitations have constraint the dynamic range that a reference voltage generator can provide. Since a further dynamic range is required, an enhanced circuit structure to overcome the issue is also desirable.

BRIEF SUMMARY OF THE INVENTION

An exemplary embodiment of a reference buffer circuit is provided, comprising a buffering stage and a driving stage. The buffering stage provides a first driving voltage based on a first input voltage. The driving stage is driven by the first driving voltage to output a first output voltage.

In the buffering stage, a first operational amplifier has a first input end for receiving the first input voltage, a second input end, and an output end for outputting a first tracking voltage. A first charge pump is coupled to the output end of the first operational amplifier, for shifting a level of the first tracking voltage to generate the first driving voltage. A first buffering transistor has a drain coupled to a first supply voltage, a source connected to the second input end of the first operational amplifier, and a gate coupled to the first charge pump for receiving the first driving voltage.

In the first charge pump, a first capacitor is coupled between the output end of the first operational amplifier and the gate of the first buffering transistor. A plurality of switches are provided, coupling a voltage temporarily stored in a second capacitor to the first capacitor so as to shift the level of the first tracking voltage to generate the first driving voltage.

The plurality of switches are arranged to operate in two modes. In a first mode, the switches disconnect the second capacitor from the first capacitor, and connect the second capacitor to a charge source to be charged thereby. In a second mode, the switches disconnect the second capacitor from the charge source, and connect the second capacitor between the output end of the first operational amplifier and the gate of the first buffering transistor.

In the driving stage, a first low pass filter (LPF) may be provided to connect to the gate of the first buffering transistor, for low-pass filtering the first driving voltage to output a first filtered voltage. A first driving transistor has a drain for receiving the first supply voltage, a gate coupled to the first LPF for receiving the first filtered voltage, and a source for outputting the first output voltage.

The buffering stage may further be arranged to provide a second driving voltage based on a second input voltage. The driving stage may further be arranged to be driven by the second driving voltage to output a second output voltage. The buffering stage may further comprise a second operational amplifier, a second charge pump and a second buffering transistor arranged symmetrically to the first ones. The second charge pump has a structure identical to the first charge pump. Likewise, in the driving stage, a second low pass filter and a second driving transistor form a similar structure as the first ones.

In the buffering stage, a buffering stage resistor may further be provided, coupled between the sources of the first buffering transistor and the second buffering transistor. The driving stage may further comprise a driving stage resistor coupled between the sources of the first driving transistor and the second driving transistor.

In another embodiment of the reference buffer circuit, a first transistor has a drain for receiving a first supply voltage, and a gate controlled by a first driving voltage, and a source to output a first output voltage. The reference buffer circuit further comprises a first operational amplifier having a first input end for receiving a first input voltage, a second input end connected to the source of the first transistor, and an output end for outputting a first tracking voltage, and a first charge pump coupled to the output end of the first operational amplifier, for shifting the level of first tracking voltage to generate the first driving voltage.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

As described in the admitted prior art, the first operational amplifier OP1 forms a tracking loop with the first NMOS transistor M1, and the second operational amplifier OP2 forms a tracking loop with the first PMOS transistor M2. The second NMOS transistor M3 forms a replica circuit of the first NMOS transistor M1, and the second PMOS transistor M4 forms a replica circuit of the first PMOS transistor M2. The second NMOS transistor M3 and second PMOS transistor M4 would be shut down if the gate-to-source voltage drops below the threshold voltages of second NMOS transistor M3 and second PMOS transistor M4, thereby the source voltages $V_{outH}$ and $V_{outL}$ are respectively limited by the gate voltages $V_{GH}$ and $V_{GL}$. So in the embodiment, an approach is provided to adjust the gate voltages without affecting the tracking loops.

Figure 1:
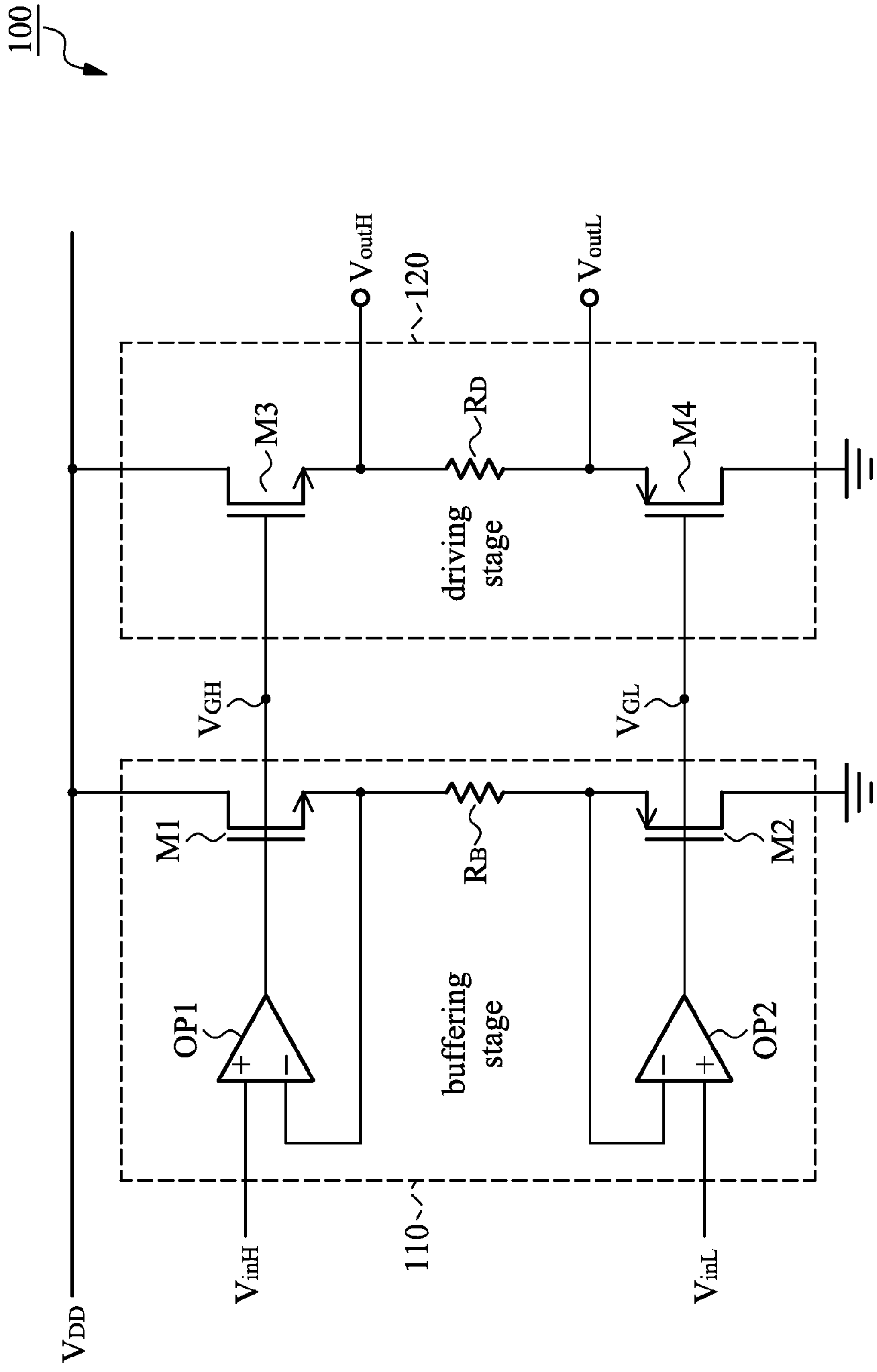
FIG. 1 (PRIOR ART)
FIG. 1 shows a conventional reference buffer circuit 100.
Figure 2:
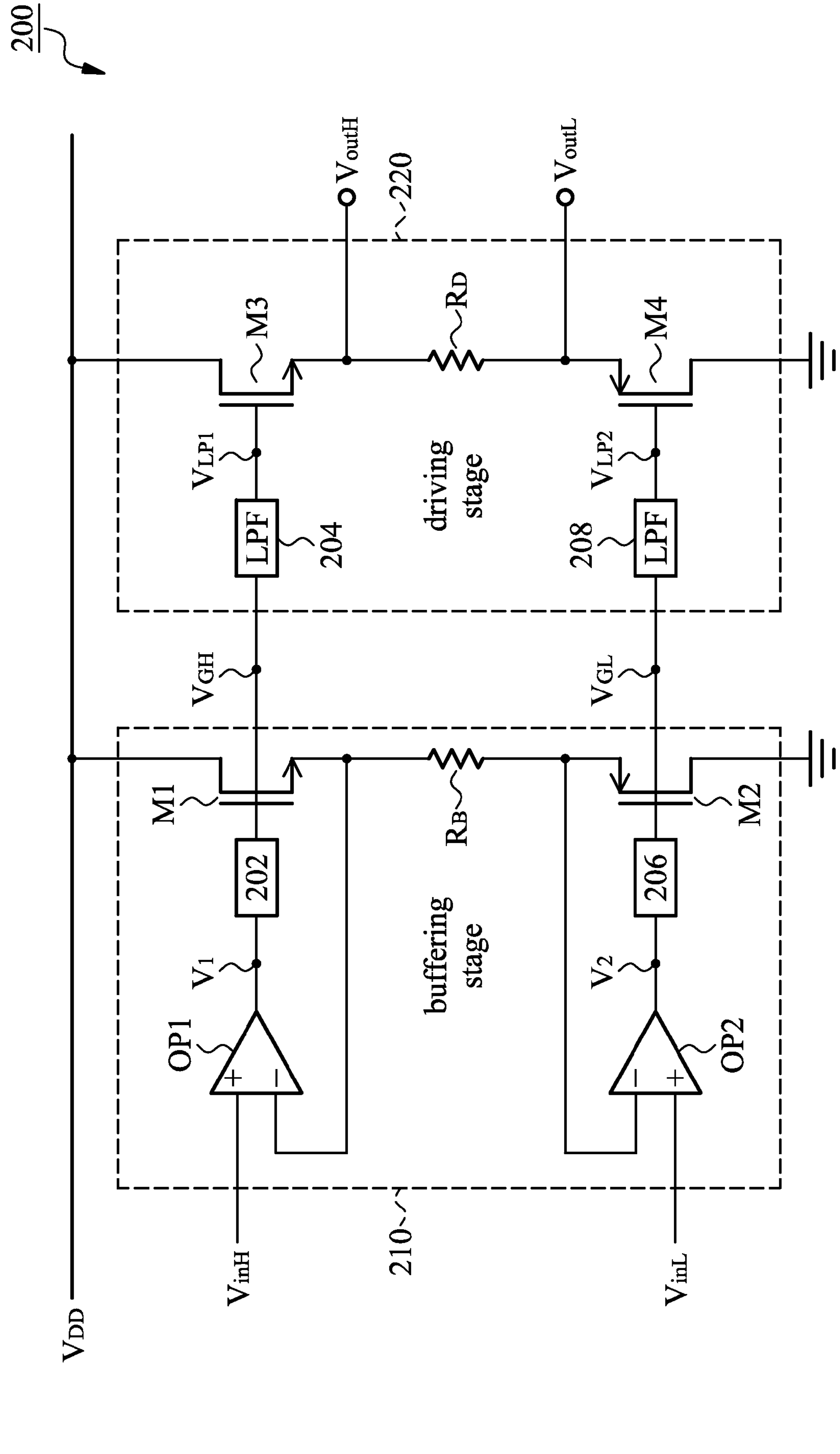
FIG. 2 shows an embodiment of a reference buffer circuit 200 according to the invention.

FIG. 2 shows an embodiment of a reference buffer circuit 200 according to the invention. The reference buffer circuit 200 has voltage level shifters (e.g. charge pumps) added to the tracking loop of the first operational amplifier OP1 and/or the tracking loop of the second operational amplifier OP2. In the buffering stage 210, a high driving voltage $V_{GH}$ and a low driving voltage $V_{GL}$ are respectively generated based on a high input voltage $V_{inH}$ and a low input voltage $V_{inL}$. A first charge pump 202 is placed between the first operational amplifier OP1 and the first NMOS transistor M1, allowing the high driving voltage $V_{GH}$ to be adjusted (e.g. to be increased) while keeping the operation of the first operational amplifier OP1 stable. Symmetrically, a second charge pump 206 can be placed between the second operational amplifier OP2 and the first PMOS transistor M2 to adjust (e.g. to lower) the low driving voltage $V_{GL}$ without affecting the operation of the second operational amplifier OP2. Such that the dynamic range between the high driving voltage $V_{GH}$ and the low driving voltage $V_{GL}$ can be increased. Consequently, the driving stage 220 is driven by the high driving voltage $V_{GH}$ and the low driving voltage $V_{GL}$ to output a high output voltage $V_{outH}$ and a low output voltage $V_{outL}$ with wider dynamic range. Although the embodiment of the reference buffer circuit 200 has shown two charge pumps 202 and 206, it is not necessarily to simultaneously implement both the first charge pump 202 and second charge pump 206 in the reference buffer circuit 200. An alternative embodiment with only one charge pump (202 or 206) is also possible. The first charge pump 202 and second charge pump 206 have similar structures, and detailed embodiments are described in the embodiment of FIG. 4.

In the buffering stage 210 of FIG. 2, the first operational amplifier OP1 has a first input end for receiving the high input voltage $V_{inH}$, a second input end connected to the source of the first NMOS transistor M1, and an output end for outputting a first tracking voltage $V_1$. The first charge pump 202 is connected to the output end of the first operational amplifier OP1 to shift the level of first tracking voltage $V_1$ to generate the high driving voltage $V_{GH}$. Specifically, the first charge pump 202 renders a voltage drop between the first tracking voltage $V_1$ and the high driving voltage $V_{GH}$, such that the high driving voltage $V_{GH}$ is kept higher than the first tracking voltage $V_1$, and consequently, the first NMOS transistor M1 can be kept enabled at a lower higher driving voltage $V_{GH}$ while the first operational amplifier OP1 keeps operative at a low first tracking voltage $V_1$. The first NMOS transistor M1 has a drain for receiving a supply voltage $V_{DD}$, and a gate driven by the high driving voltage $V_{GH}$ output from the first charge pump 202.

For the lower end, the second charge pump 206 serves a similar function as the first charge pump 202. The second operational amplifier OP2 has a first input end connected to the low input voltage $V_{inL}$, a second input end connected to the source of the first PMOS transistor M2, and an output end for outputting a second tracking voltage $V_2$. The second charge pump 206 is connected to the output end of the second operational amplifier OP2 to generate a voltage drop between the second tracking voltage $V_2$ and the low driving voltage $V_{GL}$, such that the first PMOS transistor M2 can be kept enabled at a lower low driving voltage $V_{GL}$ while the second operational amplifier OP2 is locked at a higher second tracking voltage $V_2$.

As an optional embodiment, in the driving stage 220, a first LPF 204 is provided, connected to the gate of the first NMOS transistor M1, performing low pass filtering on the high driving voltage $V_{GH}$ to output a first filtered voltage $V_{LP1}$. A second NMOS transistor M3 has a drain for receiving the supply voltage $V_{DD}$, a gate driven by the second filtered voltage $V_{LP2}$ provided by the first LPF 204, and a source for outputting the high output voltage $V_{outH}$. The first LPF 204 is deployed in order to prevent voltage spikes on the gate of first NMOS transistor M1 from the source of NMOS transistor M3.) The first LPF 204 is a support unit for the first charge pump 202, and is required when the first charge pump 202 is implemented.

For the lower end, a second LPF 208 serves a similar function as the first LPF 204, connected to the gate of the first PMOS transistor M2 to filter the low driving voltage $V_{GL}$, such that a second filtered voltage $V_{LP2}$ is output to drive the second PMOS transistor M4. The second PMOS transistor M4 has a drain connected to a signal ground, a gate driven by the second filtered voltage $V_{LP2}$ provided by the first LPF 204, and a source for outputting the low output voltage $V_{outL}$. In this ways, any voltage spike on the gate of first PMOS transistor M2 can be filtered without affecting the second PMOS transistor M4. Like the first LPF 204, the second LPF 208 is a support unit for the second charge pump 206, and is required when the second charge pump 206 is implemented.

As an alternative example, the buffering stage 210 may further comprise a buffering stage resistor $R_B$ coupled to the sources of the first NMOS transistor M1 and first PMOS transistor M2 to provide a certain voltage drop. Likewise, the driving stage 220 comprises a driving stage resistor $R_D$ coupled to the sources of the second NMOS transistor M3 and the second PMOS transistor M4.

In the embodiment of FIG. 2, since the first charge pump 202 and second charge pump 206 can dynamically shift the high driving voltage $V_{GH}$ and low driving voltage $V_{GL}$, it is possible to provide a higher high output voltage $V_{outH}$ and a lower low output voltage $V_{outL}$ without turning off the first NMOS transistor M1 or first PMOS transistor M2. Furthermore, the first operational amplifier OP1 and second operational amplifier OP2 can remain normal operation because the first tracking voltage $V_1$ and second tracking voltage $V_2$ are kept at their locked potentials. Although the reference buffer circuit 200 has a differential structure simultaneously providing a high output voltage $V_{OUTH}$ and a low output voltage $V_{OUTL}$, the embodiment of the reference buffer circuit 200 can be modified to become a single-end structure providing only the high output voltage $V_{OUTH}$, or only the low output voltage $V_{OUTL}$ because the upper part and lower part of the reference buffer circuit 200 are symmetric structures separated by the resistors $R_B$ and $R_D$. If the upper part (including the first operational amplifier OP1, the first charge pump 202, the first NMOS transistor M1, the first LPF 204 and the second NMOS transistor M3) is not implemented, the resistors $R_B$ and $R_D$ can be modified to be directly connected to the supply voltage $V_{DD}$. Conversely, if the lower part (including the second operational amplifier OP2, the second charge pump 206, the first PMOS transistor M2, the second LPF 208 and the second PMOS transistor M4) is not implemented in the reference buffer circuit 200, the resistors $R_B$ and $R_D$ can be modified to be directly connected to the voltage ground.

Figure 3:
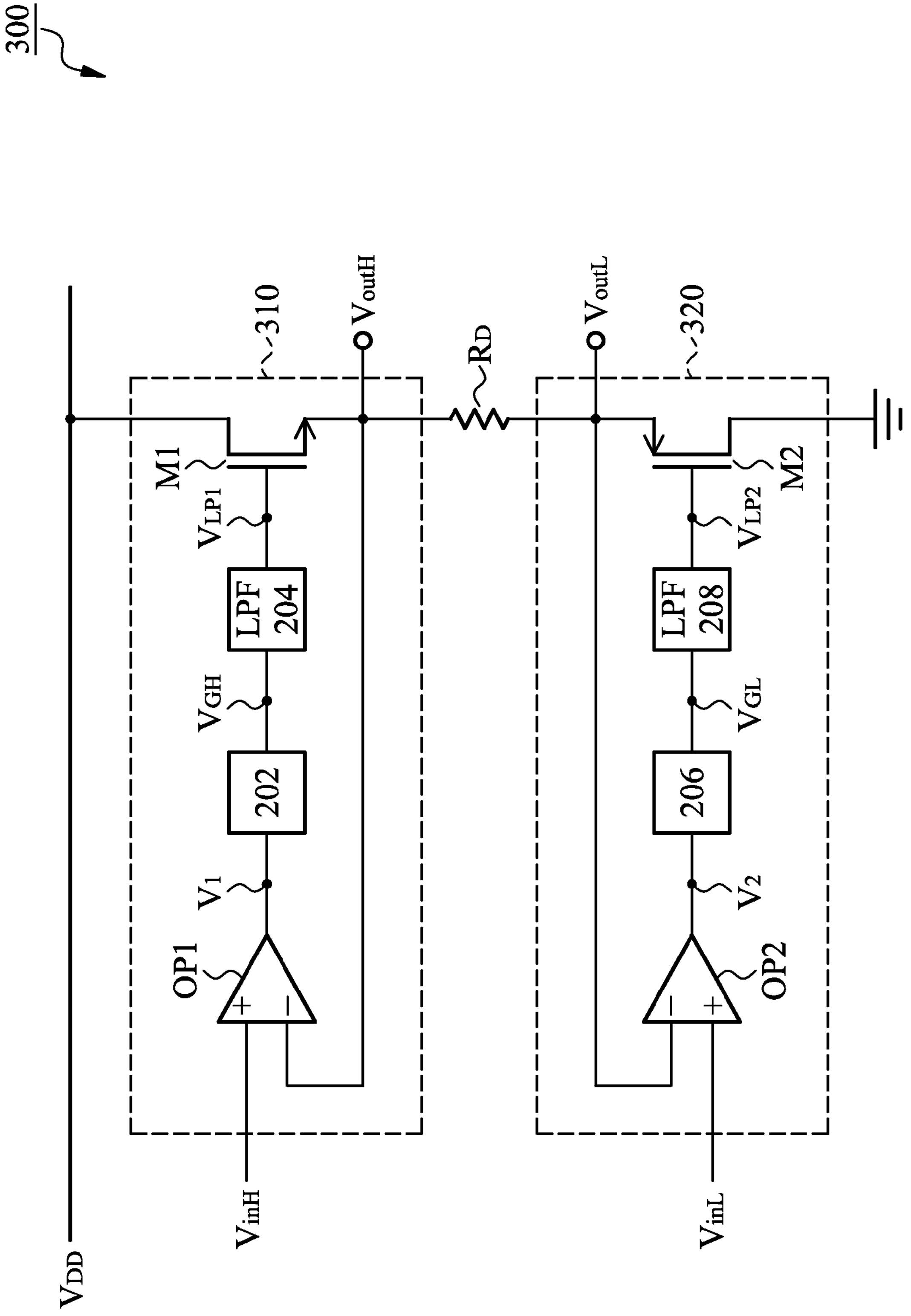
FIG. 3 shows an alternative embodiment of a reference buffer circuit 200 according to the invention.

FIG. 3 shows an alternative embodiment of a reference buffer circuit 300 according to the invention, in which the buffering stage is directly used as a driving stage. The embodiment of reference buffer circuit 300 shows a first driving stage 310 and a second driving stage 320. The first driving stage 310 is connected to a supply voltage $V_{DD}$, providing a high output voltage $V_{outH}$ based on a high input voltage $V_{inH}$; and the second driving stage 320 is connected to the signal ground for providing a low output voltage $V_{outL}$ based on a low input voltage $V_{inL}$. The first driving stage 310 and second driving stage 320 are preferably but not essentially symmetric. In the first driving stage 310, a first NMOS transistor M1 has a drain for receiving the supply voltage $V_{DD}$, and a gate controlled by a first filtered voltage $V_{LP1}$, and a source to output the high output voltage $V_{outH}$. The first operational amplifier OP1 has a first input end (+) for receiving the high input voltage $V_{inH}$, a second input end (−) connected to the source of the first NMOS transistor M1, and an output end for outputting a first tracking voltage $V_1$. A first charge pump 202 is connected to the output end of the first operational amplifier OP1 to provide a voltage drop between the first tracking voltage $V_1$ and a high driving voltage $V_{GH}$. A first LPF 204 is connected to the first charge pump 202 and the gate of the first NMOS transistor M1, performing low pass filtering on the high driving voltage $V_{GH}$ to output the first filtered voltage $V_{LP1}$. The first LPF 204 is an optional component, whereby voltage spikes generated by the first charge pump 202 can be filtered. If the first LPF 204 is not deployed, the gate of first NMOS transistor M1 can be directly controlled by the high driving voltage $V_{GH}$ output from the first charge pump 202.

Regarding to the low end, the second driving stage 320 comprises a first PMOS transistor M2, having a drain connected to the signal ground, a gate controlled by a second filtered voltage $V_{LP2}$, and a source to output the low output voltage $V_{outL}$. A second operational amplifier OP2 has a first input end for receiving the low input voltage $V_{inL}$, a second input end connected to the source of the first PMOS transistor M2, and an output end for outputting a second tracking voltage $V_2$. A second charge pump 206 is coupled to the output end of the second operational amplifier OP2 to provide a voltage drop between the second tracking voltage $V_2$ and the low driving voltage $V_{GL}$. A second LPF 208 is connected to the second charge pump 206 and the gate of the first PMOS transistor M2, performing low pass filtering on the low driving voltage $V_{GL}$ to output a second filtered voltage $V_{LP2}$. Like the first LPF 204 in the first driving stage 310, the second LPF 208 is an optional component. The second driving stage 320 may also be implemented without the second LPF 208, whereby the first PMOS transistor M2 is directly driven by the low driving voltage $V_{GL}$ provided by the second charge pump 206.

As an alternative embodiment, a resistor $R_D$ may be provided between the first driving stage 310 and the second driving stage 320, coupled to the sources of the first NMOS transistor M1 and the first PMOS transistor M2 to provide a desired voltage drop. In the embodiment of FIG. 3, the first charge pump 202 and second charge pump 206 can shift the high driving voltage $V_{GH}$ and low driving voltage $V_{GL}$, thus it is possible to provide a higher high output voltage $V_{outH}$ and a lower low output voltage $V_{outL}$ without turning off the first NMOS transistor M1 or the first PMOS transistor M2. Furthermore, the first operational amplifier OP1 and second operational amplifier OP2 can remain normal operation because the first tracking voltage $V_1$ and second tracking voltage $V_2$ are kept at their locked potentials.

Although the reference buffer circuit 300 has a differential structure that simultaneously provides a high output voltage $V_{OUTH}$ and a low output voltage $V_{OUTL}$, the embodiment of the reference buffer circuit 300 can be modified to become a single-end structure that provides only the high output voltage $V_{OUTH}$ or only the low output voltage $V_{OUTL}$ because the upper part and lower part of the reference buffer circuit 200 are symmetric structures separated by the resistor $R_D$. If the upper part (including the first operational amplifier OP1, the first charge pump 202, the first NMOS transistor M1, and the first LPF 204) is not implemented, the resistor $R_D$ can be modified to be directly connected to the supply voltage $V_{DD}$. Conversely, if the lower part (including the second operational amplifier OP2, the second charge pump 206, the first PMOS transistor M2, and the second LPF 208) is not implemented in the reference buffer circuit 300, the resistor $R_D$ can be modified to be directly connected to the voltage ground.

Figure 4:
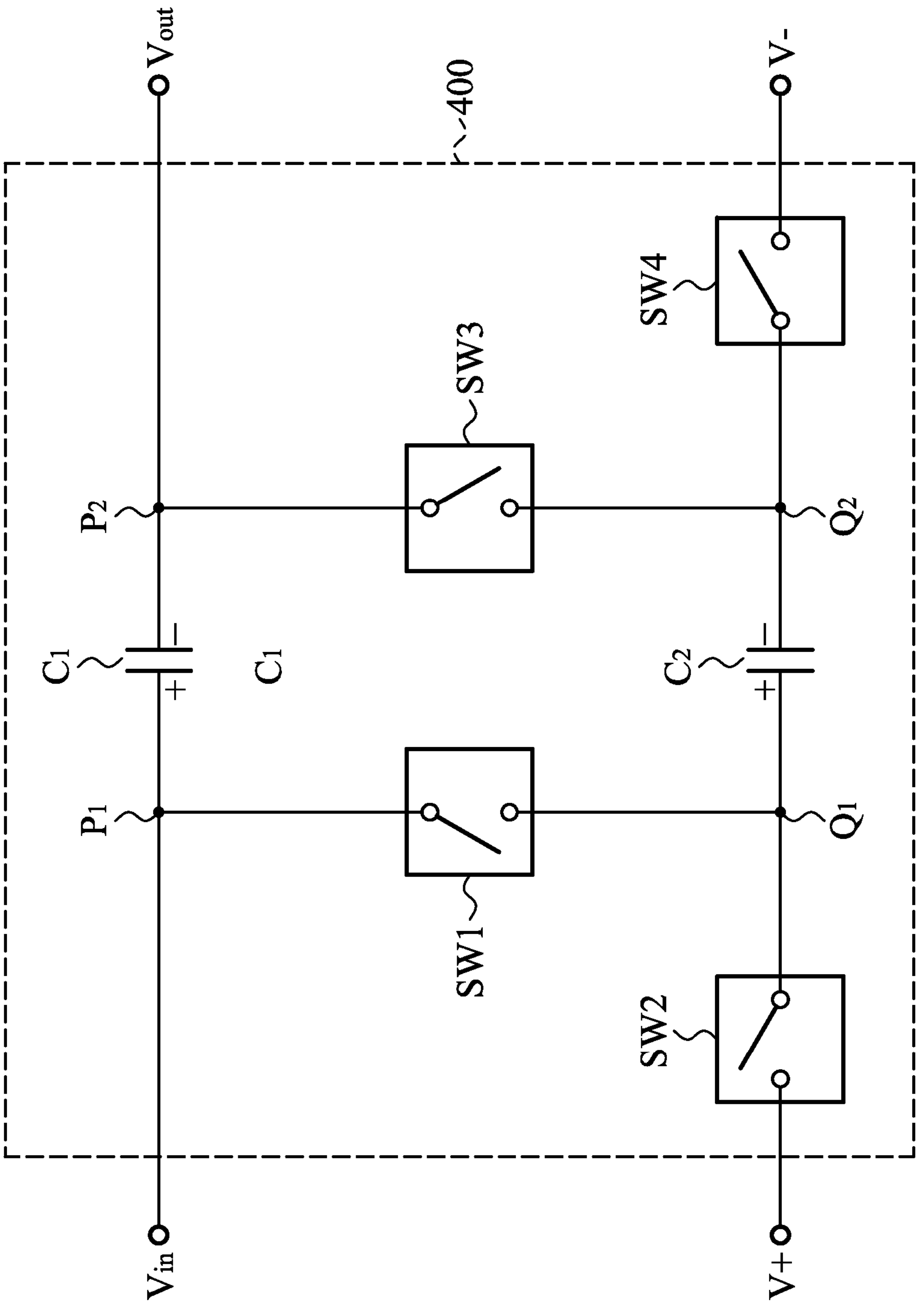
FIG. 4 shows the first charge pump 202 adapted in FIGS. 2 and 3.

FIG. 4 shows a detailed circuit structure of a charge pump 400 adaptable for the first charge pump 202 and second charge pump 206 of FIGS. 2 and 3. Basically, the first charge pump 202 and second charge pump 206 have identical circuit deployments as shown in the charge pump 400, essentially comprising two capacitors and four switches. A first capacitor $C_1$ has a first end $P_1$ and a second end $P_2$, and a second capacitor $C_2$ has a positive end $Q_1$ and a negative end $Q_2$. A first switch SW1 is deployed between the first end $P_1$ and the positive end $Q_1$, whereas a third switch SW3 is deployed between the second end $P_2$ and the negative end $Q_2$. The positive end $Q_1$ is also connectable to a positive voltage source V+ through a second switch SW2, and the negative end $Q_2$ is connectable to a negative voltage source V− through a fourth switch SW4. The four switches periodically operate in a first mode and a second mode, such that the first capacitor $C_1$ and second capacitor $C_2$ function as a charge pump to provide an input voltage $V_{in}$ and an output voltage $V_{out}$. In the first mode, the first switch SW1 and third switch SW3 are open, so the second capacitor $C_2$ is disconnected from the first capacitor $C_1$. Simultaneously, the second switch SW2 and fourth switch SW4 are closed, connecting the second capacitor $C_2$ to a charge source (V+ and V−). Consequently, the second capacitor $C_2$ is charged by the charge source for a certain period until the mode is switched to a second mode.

In the second mode, the second switch SW2 and fourth switch SW4 are open, so the second capacitor $C_2$ is disconnected from the charge source. Simultaneously, the first switch SW1 and third switch SW3 are closed, such that the positive end $Q_1$ and negative end $Q_2$ are respectively connected to the first end $P_1$ and second end $P_2$, allowing the second capacitor $C_2$ to charge the first capacitor $C_1$. In the embodiment, the capacitance of second capacitor $C_2$ is subsequently larger than the first capacitor $C_1$. The first and second modes are separated by a non-operating period during which all the four switches are open, whereby the second capacitor $C_2$ is isolated from the first capacitor $C_1$ and the charge source.

The charging processes between first and second modes are repeatedly and alternatively switched, thus, the first capacitor $C_1$ is gradually charged to a certain potential. When the mode is switched to the first mode, the SW1 and SW3 are open, and the potential in first capacitor $C_1$ sets up a voltage drop between the first end $P_1$ and the second end $P_2$. If the charge pump 400 is adapted to be the first charge pump 202 in FIG. 2 or FIG. 3, the first end $P_1$ is connected to the first operational amplifier OP1 to receive the first tracking voltage $V_1$ as the input voltage $V_{in}$, and the second end $P_2$ provides the output voltage $V_{out}$ to be the high driving voltage $V_{GH}$. Likewise, if the charge pump 400 is adapted to be the second charge pump 206 in FIG. 2 or FIG. 3, the input voltage $V_{in}$ on the first end $P_1$ would be the second tracking voltage $V_2$, and the output voltage $V_{out}$ on the second end $P_2$ would be the low driving voltage $V_{GL}$.

Figure 5:
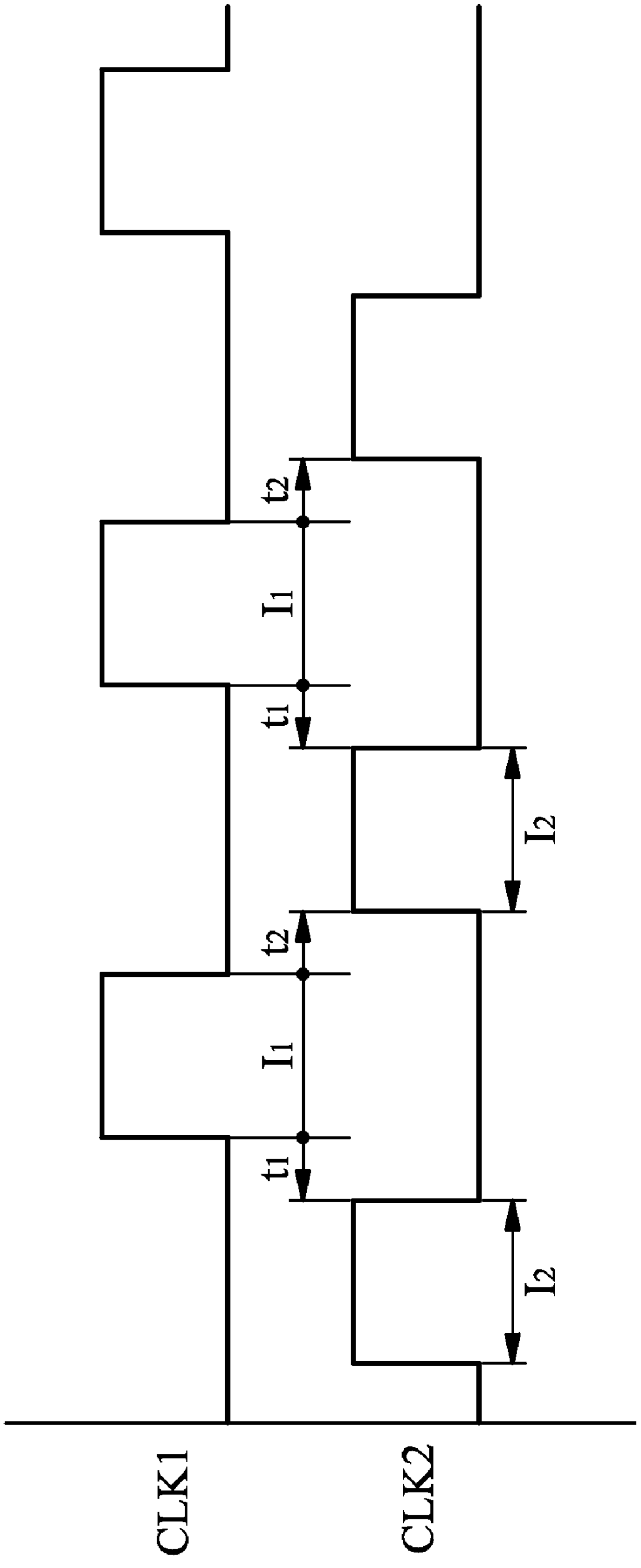
FIG. 5 shows a timing diagram of the clock signals controlling the switches SW1-SW4 in FIG. 4.

FIG. 5 shows a timing diagram of the clock signals controlling the switches SW1-SW4, wherein the first clock signal CLK1 controls the open/closed state of the switches SW1 and SW3, and the second clock signal CLK2 controls the open/closed state of the switches SW2 and SW4. The charge pump is initialized in a second mode, during which the second capacitor $C_2$ is charged for a second interval $I_2$, with the first capacitor $C_1$ uncharged. The second mode is followed by a non-operating period $t_1$ during which both the first capacitor $C_1$ and second capacitor $C_2$ are isolated. Thereafter, the mode is switched to the first mode, during which the first capacitor $C_1$ is charged by the second capacitor $C_2$ for a first interval $I_1$. Another non-operating period $t_2$ follows the first mode, during which both the first capacitor $C_1$ and second capacitor $C_2$ are again isolated. And then another second mode is repeated. The non-operating periods $t_1$ and $t_2$ are preferably but not essentially identical. In the embodiment, the capacitance of second capacitor $C_2$ is subsequently smaller than the first capacitor $C_1$.

Figure 6:
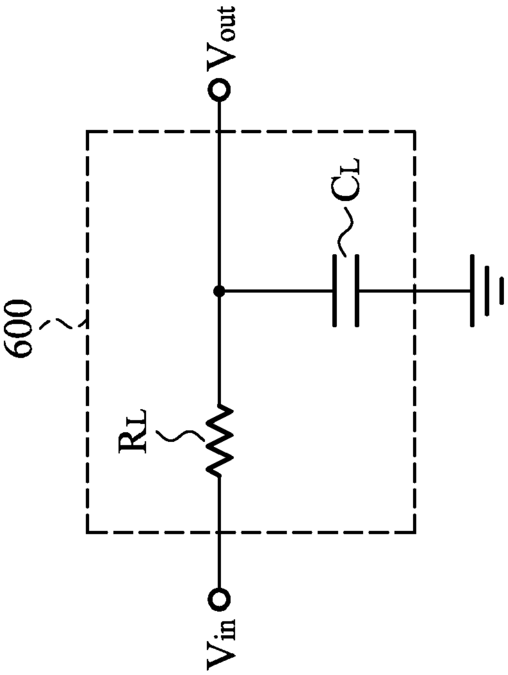
FIG. 6 shows an embodiment of a low pass filter (LPF) 600.

FIG. 6 shows an embodiment of an LPF 600. The first LPF 204 and second LPF 208 described in FIGS. 2 and 3 may be implemented by the LPF 600, in which an RC circuit is simply provided with an input voltage $V_{in}$ and an output voltage $V_{out}$. For example, if the LPF 600 is adapted to implement the first LPF 204, the input voltage $V_{in}$ is the high driving voltage $V_{GH}$, and the output voltage $V_{out}$ is the first filtered voltage $V_{LP1}$. Likewise, if the LPF 600 is implemented to be the second LPF 208, the low driving voltage $V_{GL}$ is input as the input voltage $V_{in}$, and the output voltage $V_{out}$ is output to be the second filtered voltage $V_{LP2}$. There may be various ways to implement a LPF circuit, and the invention is not limited thereto.

According to the described embodiments, it is possible to implement a charge-pump circuit providing a voltage drop without additional static current consumption. A lower or even negative voltage is generated to compensate the voltage headroom reduction due to the source follower, and hence offering a further lower low output voltage $V_{outL}$. The advantage of the implementation of the charge pump 400 is that it requires only two clock phases CLK1 and CLK2. The dynamic range between the high output voltage $V_{outH}$ and the low output voltage $V_{outL}$ is increased, allowing a robust operation of data conversion under lower power supply. The described structure can be widely and flexibly applied to any reference generator circuits.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A reference buffer circuit, comprising:

a buffering stage, for providing a first driving voltage based on a first input voltage; and a driving stage, arranged to be driven by the first driving voltage to output a first output voltage;

wherein the buffering stage comprises:

a first operational amplifier, having a first input end for receiving the first input voltage, a second input end, and an output end for outputting a first tracking voltage;

a first charge pump, coupled to the output end of the first operational amplifier, for shifting a level of the first tracking voltage to generate the first driving voltage; and a first buffering transistor having a drain coupled to a first supply voltage, a source connected to the second input end of the first operational amplifier, and a gate coupled to the first charge pump for receiving the first driving voltage and providing the first driving voltage to the driving stage, and wherein the driving stage comprises:

a first low pass filter (LPF), coupled to the gate of the first buffering transistor, for low-pass filtering the first driving voltage to output a first filtered voltage; and a first driving transistor, having a drain for receiving the first supply voltage, a gate coupled to the first LPF for receiving the first filtered voltage, and a source for outputting the first output voltage.

2. The reference buffer circuit as claimed in claim 1, wherein the first charge pump comprises:
a first capacitor, coupled between the output end of the first operational amplifier and the gate of the first buffering transistor;
a second capacitor; and
a plurality of switches, for coupling a voltage temporarily stored in the second capacitor to the first capacitor so as to shift the level of the first tracking voltage to generate the first driving voltage.

3. The reference buffer circuit as claimed in claim 2, wherein the plurality of switches are arranged to:
in a first mode, disconnect the second capacitor from the first capacitor, and connect the second capacitor to a charge source to be charged thereby;
in a second mode, disconnect the second capacitor from the charge source, and connect the second capacitor between the output end of the first operational amplifier and the gate of the first buffering transistor.

4. The reference buffer circuit as claimed in claim 3, wherein a capacitance of the first capacitor is subsequently larger than that of the second capacitor.

5. The reference buffer circuit as claimed in claim 1, wherein:
the buffering stage is further arranged to provide a second driving voltage based on a second input voltage; and
the driving stage is further arranged to be driven by the second driving voltage to output a second output voltage.

6. The reference buffer circuit as claimed in claim 5, wherein the buffering stage further comprises:
a second operational amplifier, having a first input end coupled to the second input voltage, a second input end, and an output end for outputting a second tracking voltage;
a second charge pump, coupled to the output end of the second operational amplifier, for shifting a level of the second tracking voltage to generate the second driving voltage; and
a second buffering transistor having a drain coupled to a second supply voltage, a source connected to the second input end of the second operational amplifier, and a gate coupled to the second charge pump for receiving the second driving voltage.

7. The reference buffer circuit as claimed in claim 6, wherein the second charge pump comprises:
a third capacitor, coupled between the output end of the second operational amplifier and the gate of the second buffering transistor;
a fourth capacitor; and
a plurality of switches, for coupling a voltage temporarily stored in the fourth capacitor to the third capacitor so as to shift the level of the second tracking voltage to generate the second driving voltage.

8. The reference buffer circuit as claimed in claim 7, wherein the plurality of switches are arranged to:
in the first mode, disconnect the fourth capacitor from the third capacitor, and connect the fourth capacitor to a charge source to be charged thereby;
in the second mode, disconnect the fourth capacitor from the charge source, and connect the fourth capacitor between the output end of the second operational amplifier and the gate of the second buffering transistor.

9. The reference buffer circuit as claimed in claim 8, wherein a capacitance of a first capacitor is subsequently larger than that of the second capacitor.

10. The reference buffer circuit as claimed in claim 9, wherein the driving stage comprises:
a second low pass filter (LPF) for low-pass filtering the second driving voltage to output a second filtered voltage; and
a second driving transistor, having a drain for receiving the first supply voltage, a gate coupled to the second LPF for receiving the second filtered voltage, and a source for outputting the second output voltage.

11. The reference buffer circuit as claimed in claim 10, wherein:
the buffering stage further comprises a buffering stage resistor coupled between the sources of the first buffering transistor and the second buffering transistor; and
the driving stage further comprises a driving stage resistor coupled between the sources of a first driving transistor and the second driving transistor.

12. A reference buffer circuit, comprising:
a first transistor, having a drain for receiving a first supply voltage, and a gate controlled by a first driving voltage , and a source to output a first output voltage;
a first operational amplifier, having a first input end for receiving a first input voltage, a second input end connected to the source of the first transistor, and an output end for outputting a first tracking voltage;
a first charge pump, coupled to the output end of the first operational amplifier and the gate of the first transistor, for shifting a level of first tracking voltage to generate the first driving voltage; and
a first low pass filter (LPF), coupled to the gate of the first transistor for low-pass filtering the first driving voltage provided thereto.

13. The reference buffer circuit as claimed in claim 12, wherein the first charge pump comprises:
a first capacitor, coupled between the output end of the first operational amplifier and the first transistor;
a second capacitor; and
a plurality of switches, for coupling a voltage temporarily stored in the second capacitor to the first capacitor so as to shift the level of the first tracking voltage to generate the first driving voltage.

14. The reference buffer circuit as claimed in claim 13, wherein the plurality of switches are arranged to:
in a first mode, disconnect the second capacitor from the first capacitor, and connect the second capacitor to a charge source to be charged thereby;
in a second mode, disconnect the second capacitor from the charge source, and connect the second capacitor between the output end of the first operational amplifier and the first transistor.

15. The reference buffer circuit as claimed in claim 14, wherein a capacitance of the second capacitor is subsequently smaller than that of the first capacitor.

16. The reference buffer circuit as claimed in claim 12, further comprising
a second transistor, having a drain coupled to a second supply voltage, a gate controlled by a second driving voltage, and a source to output a second output voltage;
a second operational amplifier, having a first input end for receiving a second input voltage, a second input end coupled to the source of the second transistor, and an output end for outputting a second tracking voltage; and
a second charge pump, coupled to the output end of the second operational amplifier, for shifting a level of the second tracking voltage to generate the second driving voltage.

17. The reference buffer circuit as claimed in claim 16, wherein the second charge pump comprises:

a third capacitor, coupled between the output end of the second operational amplifier and the second transistor;

a fourth capacitor; and a plurality of switches, for coupling a voltage temporarily stored in the fourth capacitor to the third capacitor so as to shift the level of the second tracking voltage to generate the second driving voltage.

18. The reference buffer circuit as claimed in claim 17, wherein the plurality of switches are arranged to:

in the first mode, disconnect the fourth capacitor from a first capacitor, and connect the fourth capacitor to a charge source to be charged thereby;

in the second mode, disconnect the fourth capacitor from the charge source, and connect the fourth capacitor between the output end of the second operational amplifier and the second transistor.

19. The reference buffer circuit as claimed in claim 18, wherein the capacitance of fourth capacitor is subsequently smaller than that of the third capacitor.

* * * * *